United States Patent
Wu et al.

(10) Patent No.: US 11,101,003 B1
(45) Date of Patent: Aug. 24, 2021

(54) CLOCK AND DATA RECOVERY CIRCUIT, MEMORY STORAGE DEVICE AND SIGNAL ADJUSTMENT METHOD

(71) Applicant: PHISON ELECTRONICS CORP., Miaoli (TW)

(72) Inventors: Jen-Chu Wu, New Taipei (TW); Bo-Jing Lin, Keelung (TW); Yu-Chiang Liao, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 40 days.

(21) Appl. No.: 16/805,848

(22) Filed: Mar. 2, 2020

(30) Foreign Application Priority Data

Feb. 13, 2020 (TW) ................................. 109104441

(51) Int. Cl.
*G11C 29/02* (2006.01)
*G11C 16/32* (2006.01)
*H04L 7/00* (2006.01)
*H03L 7/093* (2006.01)
*H03L 7/081* (2006.01)

(52) U.S. Cl.
CPC ............ *G11C 16/32* (2013.01); *H03L 7/0812* (2013.01); *H03L 7/093* (2013.01); *H04L 7/0087* (2013.01)

(58) Field of Classification Search
CPC ..... G11C 29/52; G11C 16/26; G11C 16/0483; G11C 16/10; G11C 11/5642; G11C 2029/0411; G11C 11/5628; G11C 16/08; G11C 29/028; G11C 29/42; G11C 11/5671; G11C 16/349; G11C 29/44; G11C 16/14; G11C 16/28; G11C 16/22; G11C 16/24; G11C 16/03; H04L 7/033; H03L 7/093; H03L 7/00
See application file for complete search history.

(56) References Cited

U.S. PATENT DOCUMENTS

| | | | |
|---|---|---|---|
| 10,942,541 B1 * | 3/2021 | Huang | .................. H03K 5/135 |
| 2005/0210308 A1 * | 9/2005 | Best | .......................... G06F 1/08 |
| | | | 713/503 |
| 2016/0294538 A1 | 10/2016 | Chien et al. | |
| 2019/0279692 A1 * | 9/2019 | Song | ..................... G11C 29/023 |
| 2019/0296888 A1 * | 9/2019 | Kobayashi | ............. H04J 14/02 |
| 2019/0379524 A1 | 12/2019 | Chan et al. | |

OTHER PUBLICATIONS

"Office Action of Taiwan Counterpart Application", dated Dec. 2, 2020, p. 1-p. 11.

* cited by examiner

*Primary Examiner* — Hien N Nguyen
(74) *Attorney, Agent, or Firm* — JCIPRNET (57) ABSTRACT

A clock and data recovery circuit, a memory storage device and a signal adjustment method are disclosed. The method includes: detecting a phase difference between a first signal and a clock signal; generating a vote signal according to the phase difference and a first clock frequency; sequentially outputting a plurality of adjustment signals according to the vote signal and a second clock frequency, wherein the first clock frequency is different from the second clock frequency; and generating the clock signal according to the sequentially output adjustment signals.

19 Claims, 5 Drawing Sheets

CLOCK AND DATA RECOVERY CIRCUIT, MEMORY STORAGE DEVICE AND SIGNAL ADJUSTMENT METHOD

CROSS-REFERENCE TO RELATED APPLICATION

This application claims the priority benefit of Taiwan application serial no. 109104441, filed on Feb. 13, 2020. The entirety of the above-mentioned patent application is hereby incorporated by reference herein and made a part of this specification.

BACKGROUND

1. Technology Field

The invention relates to a signal adjustment technique, and more particularly, to a clock and data recovery circuit, a memory storage device and a signal adjustment method.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In general, a memory storage device is usually in-built with a clock and data recovery (CDR) circuit for correcting a data signal and a clock signal. As a transmission frequency of the data signal continues to increase, a clock correction efficiency and a jitter suppression of the clock and data recovery circuit also become more important. In certain cases, when a phase difference or a frequency difference between the data signal and the clock signal is relatively large, a jitter tolerance of the clock and data recovery circuit may be reduced due to overly large sudden adjustment on phase or frequency.

SUMMARY

The invention provides a clock and data recovery circuit, a memory storage device and a signal adjustment method that can increase the jitter tolerance of the clock and data recovery circuit.

An exemplary embodiment of the invention provides a clock and data recovery circuit, which includes a phase detector, a voter circuit, a digital loop filter and a phase interpolator. The phase detector is configured to detect a phase difference between a first signal and a clock signal. The voter circuit is coupled to the phase detector and configured to generate a vote signal according to the phase difference and a first clock frequency. The digital loop filter is coupled to the voter circuit and configured to sequentially output a plurality of adjustment signals according to the vote signal and a second clock frequency, wherein the first clock frequency is different from the second clock frequency. The phase interpolator is coupled to the phase detector and the digital loop filter and configured to generate the clock signal according to the sequentially output adjustment signals.

An exemplary embodiment of the invention further provides a memory storage device, which includes a connection interface unit, a rewritable non-volatile memory module, a memory control circuit unit and a clock and data recovery circuit. The connection interface unit is configured to couple to a host system. The memory control circuit unit is coupled to the connection interface unit and the rewritable non-volatile memory module. The clock and data recovery circuit is disposed in at least one of the connection interface unit, the rewritable non-volatile memory module and the memory control circuit unit. The clock and data recovery circuit is configured to detect a phase difference between a first signal and a clock signal. The clock and data recovery circuit is further configured to generate a vote signal according to the phase difference and a first clock frequency. The clock and data recovery circuit is further configured to sequentially output a plurality of adjustment signals according to the vote signal and a second clock frequency. The clock and data recovery circuit is further configured to generate the clock signal according to the sequentially output adjustment signals. The first clock frequency is different from the second clock frequency.

An exemplary embodiment of the invention further provides a signal adjustment method for a memory storage device. The memory storage device has a rewritable non-volatile memory module. The signal adjustment method includes: detecting a phase difference between a first signal and a clock signal; generating a vote signal according to the phase difference and a first clock frequency; sequentially outputting a plurality of adjustment signals according to the vote signal and a second clock frequency, wherein the first clock frequency is different from the second clock frequency; and generating the clock signal according to the sequentially output adjustment signals.

An exemplary embodiment of the invention further provides a clock and data recovery circuit, which includes a phase detector, a voter circuit, a digital loop filter and a phase interpolator. The voter circuit is coupled to an output of the phase detector. The digital loop filter is coupled to an output of the voter circuit. The phase interpolator is coupled to an output of the digital loop filter and the phase detector. The voter circuit operates at first clock frequency. The digital loop filter operates at a second clock frequency. The first clock frequency is different from the second clock frequency.

An exemplary embodiment of the invention further provides a memory storage device, which includes a connection interface unit, a rewritable non-volatile memory module, a memory control circuit unit and a clock and data recovery circuit. The connection interface unit is configured to couple to a host system. The memory control circuit unit is coupled to the connection interface unit and the rewritable non-volatile memory module. The clock and data recovery circuit is disposed in at least one of the connection interface unit, the rewritable non-volatile memory module and the memory control circuit unit. A voter circuit in the clock and data recovery circuit operates at first clock frequency. A digital loop filter in the clock and data recovery circuit operates at a second clock frequency. The digital loop filter is coupled to an output of the voter circuit. The first clock frequency is different from the second clock frequency.

Based on the above, after the phase difference between the first signal and the clock signal is detected, the voter circuit may generate the vote signal according to the phase difference and the first clock frequency. The digital loop filter may sequentially output the adjustment signals according to the vote signal and the second clock frequency, and the first clock frequency is different from the second clock frequency. The phase interpolator may generate the clock signal according to the sequentially output adjustment signals. As a result, the jitter tolerance of the clock and data recovery circuit may be improved.

DESCRIPTION OF THE EMBODIMENTS

Exemplary embodiments are provided below to describe the invention in detail, though the invention is not limited to the provided exemplary embodiments, and the provided exemplary embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

Figure 1:
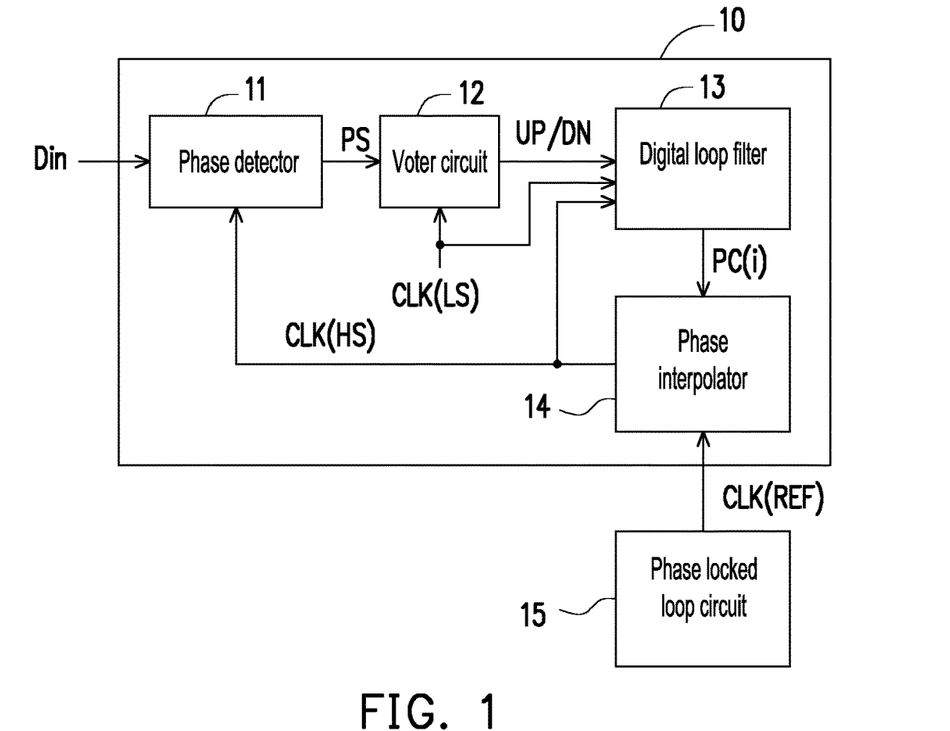
FIG. 1 is a schematic diagram illustrating a clock and data recovery circuit according to an exemplary embodiment of the invention.

FIG. 1 is a schematic diagram illustrating a clock and data recovery circuit according to an exemplary embodiment of the invention. Referring to FIG. 1, the clock and data recovery circuit 10 may be configured to receive a signal (a.k.a. a first signal) Din and generate a signal CLK(HS). The signal CLK(HS) is a clock signal.

The clock and data recovery circuit 10 may detect a phase difference between the signals Din and CLK(HS) and adjust the signal CLK(HS) according to the phase difference. For example, the clock and data recovery circuit 10 may adjust phase and/or frequency of the signal CLK(HS) according to phase and/or frequency of the signal Din. Accordingly, the clock and data recovery circuit 10 may be configured to lock the signals Din and CLK(HS) in a reset phase relation. For example, the phase difference between the signals Din and CLK(HS) may be locked at 0 degree, 90 degrees, 180 degrees, 270 degrees or 360 degrees. In an exemplary embodiment, the signal Din may be a data signal. The locked signal CLK(HS) may also be used to analyze (e.g., sample) the signal Din, so as to obtain bit data (e.g., bit I/O) transmitted by the signal Din.

The clock and data recovery circuit 10 includes a phase detector 11, a voter circuit 12, a digital loop filter 13 and a phase interpolator 14. The phase detector 11 may be configured to receive the signals Din and CLK(HS) and detect the phase difference between the signals Din and CLK(HS). The phase detector 11 may generate a signal PS according to the detected phase difference. In other words, the signal PS may reflect the phase difference between the signals Din and CLK(HS).

The voter circuit 12 is coupled to the phase detector 11 and may receive the signal PS. The voter circuit 12 may generate a signal UP/DN according to the signal PS. The signal UP/DN may be configured to change phase and/or frequency of the clock CLK(HS). For example, the signal UP may be used to advance at least one rising edge and/or at least one falling edge of the signal CLK(HS). The signal DN may be configured to delay at least one rising edge and/or at least one falling edge of the signal CLK(HS). In an exemplary embodiment, the signal UP/DN is also known as a vote signal.

The digital loop filter 13 is coupled to the voter circuit 12. The digital loop filter 12 may receive the signal UP/DN and generate a signal PC(i). The signal PC(i) may correspond to one code (or control code). This code (or control code) may be used to control phase and/or frequency of the signal CLK(HS). In an exemplary embodiment, the signal PC(i) is also known as an adjustment signal.

The phase interpolator 14 is coupled to the digital loop filter 13, the phase detector 11 and a phase lock loop (PLL) circuit 15. The phase interpolator 14 is configured to receive the signal PC(i) from the digital loop filter 13 and receive a signal CLK(REF) from the phase-locked loop circuit 15. The signal CLK(REF) is also known as a reference clock signal. For example, the signal CLK(REF) may be used as a basis of the phase interpolator 14. The phase interpolator 14 may perform a phase interpolation on the signal CLK(REF) according to the signal PC(i) to generate the signal CLK(HS). In addition, the phase interpolator 14 may adjust phase and/or frequency of the signal CLK(HS) according to the signal PC(i). The phase-locked loop circuit 15 may be included in the clock and data recovery circuit 10 or independent from the clock and data recovery circuit 10, and the invention is not limited thereto.

With collaborative operation of the phase detector 11, the voter circuit 12, the digital loop filter 13 and the phase interpolator 14, the signals Din and CLK(HS) may be locked in the preset phase relation to facilitate subsequent signal analysis. In addition, the signal CLK(HS) may also be provided and used by other circuit elements.

It should be noted that, the voter circuit 12 may operate at a specific clock frequency (a.k.a. a first clock frequency), and the digital loop filter 13 may operate at another clock frequency (a.k.a. a second clock frequency). From another perspective, the digital loop filter 13 may operate at both the first clock frequency and the second clock frequency. The first clock frequency is different from the second clock frequency. For example, the first clock frequency may be lower than the second clock frequency. For example, the first clock frequency may be 20 MHz, and the second clock frequency may be 100 MHz. Nonetheless, actual values of the first clock frequency and the second clock frequency are not particularly limited by the invention.

In an exemplary embodiment, the voter circuit 12 may receive a signal CLK(LS) and use frequency of the signal CLK(LS) as the first clock frequency. The voter circuit 12 may output the signal UP/DN according to frequency of the signal CLK(LS) and the signal PS. For example, the voter circuit 12 may be triggered by a rising edge and/or a falling edge of the signal CLK(LS) to generate the signal PS.

In an exemplary embodiment, the digital loop filter 13 may receive the signal CLK(HS) and use frequency of the signal CLK(HS) as the second clock frequency. The digital loop filter 13 may output the signal UP/DN according to frequency of the signal CLK(HS) and the signal UP/DN. For example, the digital loop filter 13 may be triggered by a rising edge and/or a falling edge of the signal CLK(HS) to output the signal PC(i).

In an exemplary embodiment, the signal CLK(LS) may be generated by, for example, dividing the signal CLK(HS). For example, one divider may be configured to divide the signal CLK(HS) to generate the signal CLK(LS). The divider may be included in the clock and data recovery circuit 10 or independent from the clock and data recovery circuit 10.

In an exemplary embodiment, a value of i is between 1 to n, and n is an integer greater than 1. The second clock frequency may be approximately n times the first clock frequency. In response to one signal UP/DN generated by the voter circuit 12, the digital loop filter 13 may sequentially output n signals PC(1) to PC(n) to the phase interpolator 14 according to the signal UP/DN and frequency of the signal CLK(HS). The phase interpolator 14 may generate the signal CLK(HS) and/or adjust phase (or frequency) of the signal CLK(HS) according to the n signals PC(1) to PC(n). In this way, the sequentially output n signals PC(1) to PC(n) may be used to gradually adjust the signal CLK(HS) to satisfy a phase difference (a.k.a. a target phase difference) or a frequency difference (a.k.a. a target frequency difference).

Figure 2:
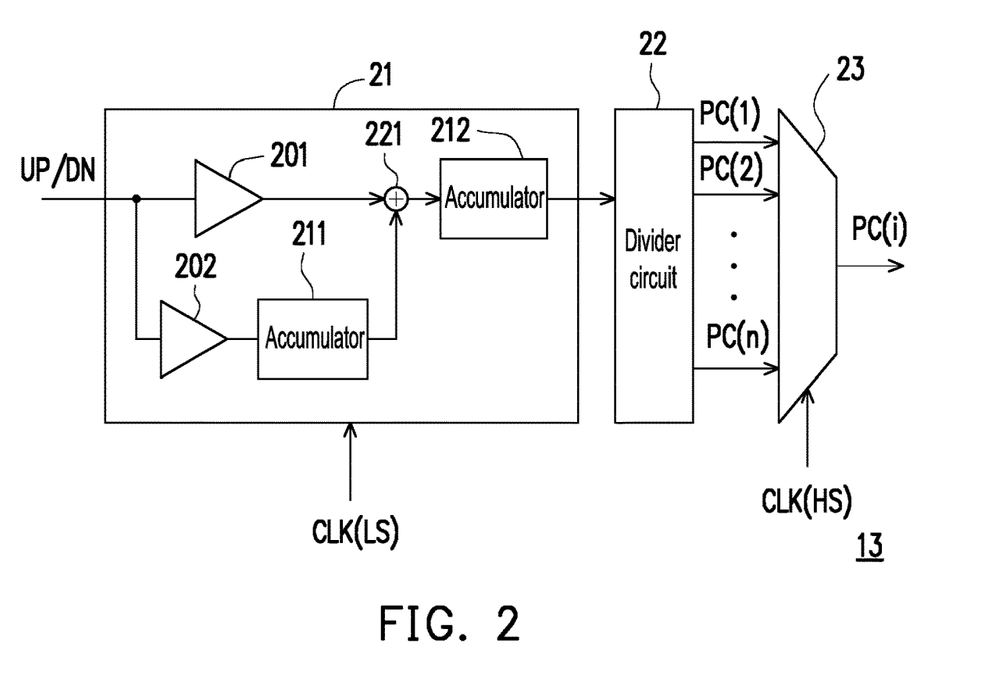
FIG. 2 is a schematic diagram illustrating a digital loop filter according to an exemplary embodiment of the invention.

FIG. 2 is a schematic diagram illustrating a digital loop filter according to an exemplary embodiment of the invention. Referring to FIG. 2, the digital loop filter 13 may include an accumulator circuit 21, the divider circuit 22 and a multiplexer 23. The accumulator circuit 21 may determine an adjustment code (a.k.a. a first adjustment code) according to the signal UP/DN and the first clock frequency. The divider circuit 22 is coupled to the accumulator circuit 21 and the multiplexer 23. The divider circuit 22 may divide the first adjustment code into a plurality of adjustment codes (a.k.a. second adjustment codes) and generate the signals PC(1) to PC(n) according to the second adjustment codes. The multiplexer 23 may sequentially output the signals PC(1) to PC(n) according to the second clock frequency.

From another perspective, a part of circuits in the digital loop filter 13 (i.e., the accumulator circuit 21 and the divider circuit 22) operate at the first clock frequency and work according to the first clock frequency (e.g., to generate the signals PC(1) to PC(n)). Another part of circuits in the digital loop filter 13 (i.e., the multiplexer 23) operate at the second clock frequency and work according to the second clock frequency (e.g., to output the signal PC(i)).

In an exemplary embodiment, the accumulator circuit 21 includes an amplifier 201, an amplifier 202, an accumulator 211, an accumulator 212 and an adder 221. Input ends of the amplifiers 201 and 202 may be coupled to an output end of the phase detector 11 of FIG. 1 to receive the signal UP/DN. An input end of the accumulator 211 may be coupled to an output end of the amplifier 202. Output ends of the accumulator 211 and the amplifier 201 may be coupled to an input end of the adder 221. The input end of the accumulator 212 may be coupled to an output end of the adder 221. The output end of the accumulator 212 may be coupled to an output end of the divider circuit 22.

In an exemplary embodiment, the amplifier 201 is also known as a proportional gain amplifier, and the amplifier 202 is also known as an integral gain amplifier. For example, the amplifier 201 may amplify a value corresponding to the signal UP/DN by N times, and the amplifier 202 may amplify a value corresponding to the signal UP/DN by M times. N is greater than M. For example, N may be 6 and/or M may be 4, but the values of N and M are not limited thereto. The value amplified by the amplifier 202 by M time may be used to update a value stored by the accumulator 211. The adder 221 may add the value stored by the accumulator 211 to a value output by the amplifier 201 and update the value stored by the accumulator 211 according to an operation result thereof. This value is the first adjustment code. The accumulator circuit 21 may receive the signal CLK(LS) and update the first adjustment code according to frequency of the signal CLK(LS) (i.e., the first clock frequency). Then, the accumulator circuit 21 may transmit a signal corresponding to the first adjustment code to the divider circuit 22.

According to an output of the accumulator circuit 21, the divider circuit 22 may generate the signals PC(1) to PC(n). Each one of the signals PC(1) to PC(n) corresponds to one second adjustment code. In an exemplary embodiment, if one first adjustment code may be used separately to adjust the signal CLK(HS) to satisfy one target phase difference or one target frequency difference at once time, the second adjustment codes corresponding to the signals PC(1) to PC(n) may then be used to commonly and gradually adjust the signal CLK(HS) to satisfy said target phase difference or said target frequency difference.

Figure 3:
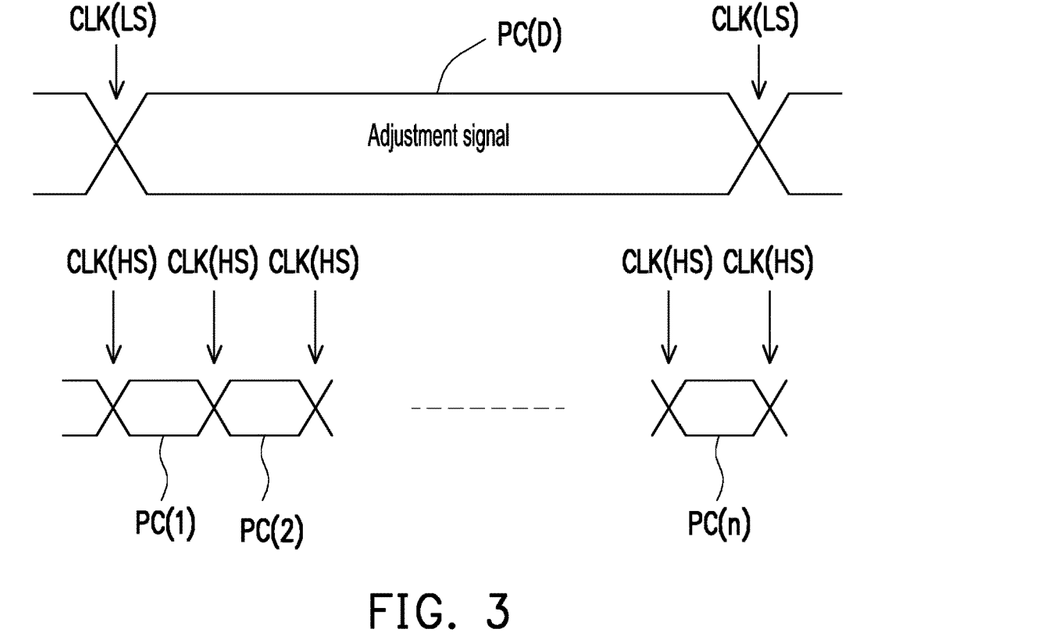
FIG. 3 is a schematic layout illustrating sequentially output adjustment signals according to an exemplary embodiment of the invention.
Figure 4:
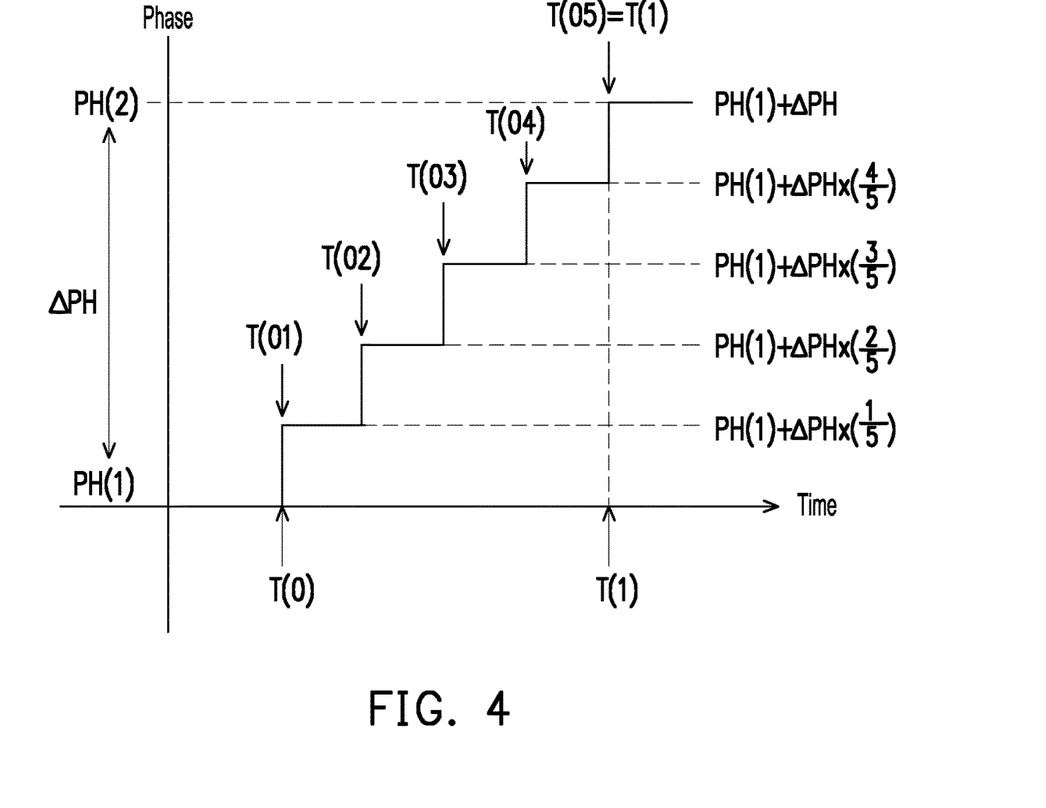
FIG. 4 is a schematic layout illustrating how a clock signal is adjusted according to the sequentially output adjustment signals according to an exemplary embodiment of the invention.

FIG. 3 is a schematic layout illustrating sequentially output adjustment signals according to an exemplary embodiment of the invention. FIG. 4 is a schematic layout illustrating how a clock signal is adjusted according to the sequentially output adjustment signals according to an exemplary embodiment of the invention.

Referring to FIG. 3 and FIG. 4, it is assumed that a signal PC(D) (i.e., the adjustment signal) that traditionally corresponds to the first adjustment code may be output according to a triggering of the signal CLK(LS), and the signal PC(D) may instruct the phase interpolator 14 of FIG. 1 to adjust phase (or frequency) of the signal CLK(HS) from a current value PH(1) to a target value PH(2) between time points T(0) to T(1) at once time. A difference between the current value PH(1) and the target value PH(2) is $\Delta PH$ (i.e., the target phase difference or the target frequency difference).

In an exemplary embodiment, the signals PC(1) to PC(n) are sequentially output according to a triggering of the signal CLK(HS). According to the sequentially output signals PC(1) to PC(n), at time points T(01) to T(05), phase (or frequency) of the signal CLK(HS) is gradually and stably adjusted from the current value PH(1) to the target value PH(2). A difference between the current value PH(1) and the target value PH(2) is also $\Delta PH$ (i.e., the target phase difference or the target frequency difference).

In an exemplary embodiment, it is assumed that n=5. At the time point T(01), in response to the signal PC(1), phase (or frequency) of the signal CLK(HS) is adjusted from the current value PH(1) to $PH(1)+\Delta PH \times (1/5)$; at the time point T(02), in response to the signal PC(2), phase (or frequency) of the signal CLK(HS) is adjusted to $PH(1)+\Delta PH \times (2/5)$; at the time point T(03), in response to the signal PC(3), phase (or frequency) of the signal CLK(HS) is adjusted to $PH(1)+\Delta PH \times (3/5)$; at the time point T(04), in response to the signal PC(4), phase (or frequency) of the signal CLK(HS) is adjusted to $PH(1)+\Delta PH \times (4/5)$; and at the time point T(05), in response to the signal PC(5), phase (or frequency) of the signal CLK(HS) is adjusted to PH(1)+ΔPH=PH(2).

Compared with the signal CLK(HS) adjusted according to the signal PC(D), by stably adjusting phase (or frequency) of the signal CLK(HS) to the target value PH(2) according to the sequentially output signals PC(1) to PC(n), the clock and data recovery circuit 10 of FIG. 1 may have a higher jitter tolerance. In particular, if ΔPH (i.e., the target phase difference or the target frequency difference) is greater, the advantages of adjusting the signal CLK(HS) in stages can be more prominent.

In an exemplary embodiment, the clock and data recovery circuit 10 of FIG. 1 may be disposed in the memory storage device to receive the signal Din from a host system. However, in another exemplary embodiment, the clock and data recovery circuit 10 of FIG. 1 may also be disposed in other type of electronic device, and is not limited to the memory storage device.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 5:
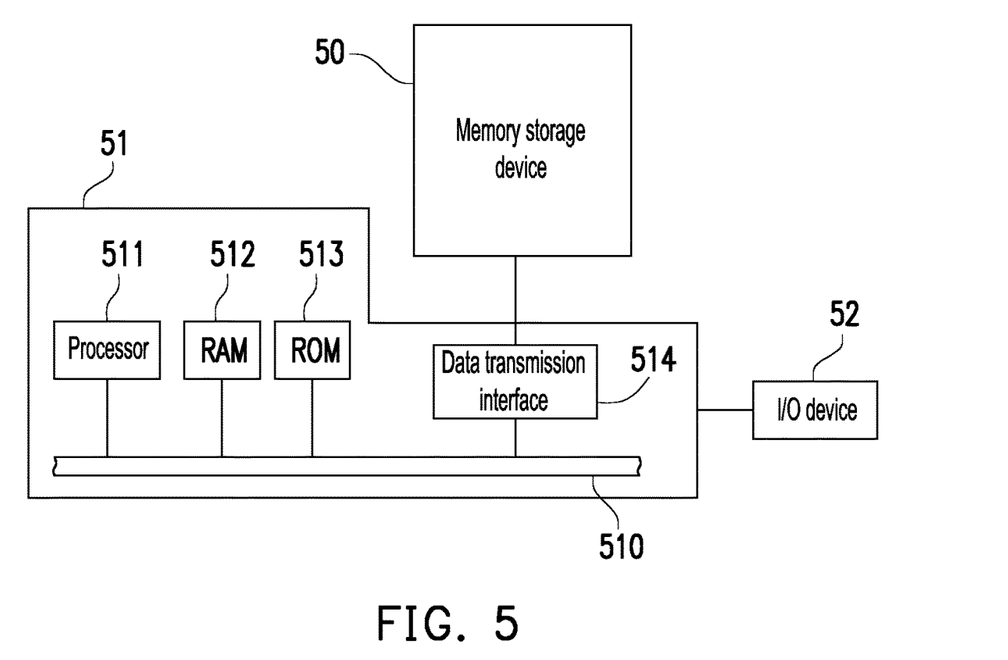
FIG. 5 is a schematic diagram illustrating a host system, a memory storage device and an I/O (input/output) device according to an exemplary embodiment of the invention.
Figure 6:
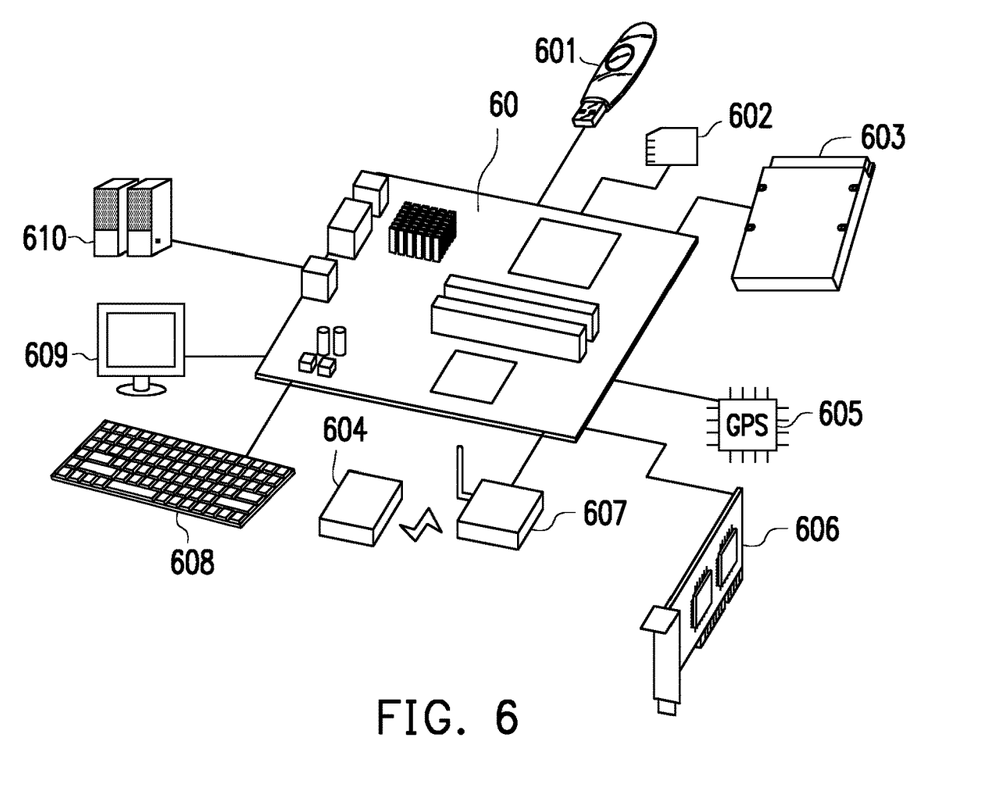
FIG. 6 is a schematic diagram illustrating a host system, a memory storage device and an I/O device according to another exemplary embodiment of the invention.

FIG. 5 is a schematic diagram illustrating a host system, a memory storage device and an I/O (input/output) device according to an exemplary embodiment of the invention. FIG. 6 is a schematic diagram illustrating a host system, a memory storage device and an I/O device according to another exemplary embodiment of the invention.

Referring to FIG. 5 and FIG. 6, a host system 51 generally includes a processor 511, a RAM (random access memory) 512, a ROM (read only memory) 513 and a data transmission interface 514. The processor 511, the RAM 512, the ROM 513 and the data transmission interface 514 are coupled to a system bus 510.

In this exemplary embodiment, the host system 51 is coupled to a memory storage device 50 through the data transmission interface 514. For example, the host system 51 can store data into the memory storage device 50 or read data from the memory storage device 50 via the data transmission interface 514. Further, the host system 51 is coupled to an I/O device 52 via the system bus 510. For example, the host system 51 can transmit output signals to the I/O device 52 or receive input signals from the I/O device 52 via the system bus 510.

In the present exemplary embodiment, the processor 511, the RAM 512, the ROM 513 and the data transmission interface 514 may be disposed on a main board 60 of the host system 51. The number of the data transmission interface 514 may be one or more. Through the data transmission interface 514, the main board 60 may be coupled to the memory storage device 10 in a wired manner or a wireless manner. The memory storage device 50 may be, for example, a flash drive 601, a memory card 602, a SSD (Solid State Drive) 603 or a wireless memory storage device 604. The wireless memory storage device 604 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 60 may also be coupled to various I/O devices including a GPS (Global Positioning System) module 605, a network interface card 606, a wireless transmission device 607, a keyboard 608, a monitor 609 and a speaker 610 through the system bus 510. For example, in an exemplary embodiment, the main board 60 can access the wireless memory storage device 604 via the wireless transmission device 607.

Figure 7:
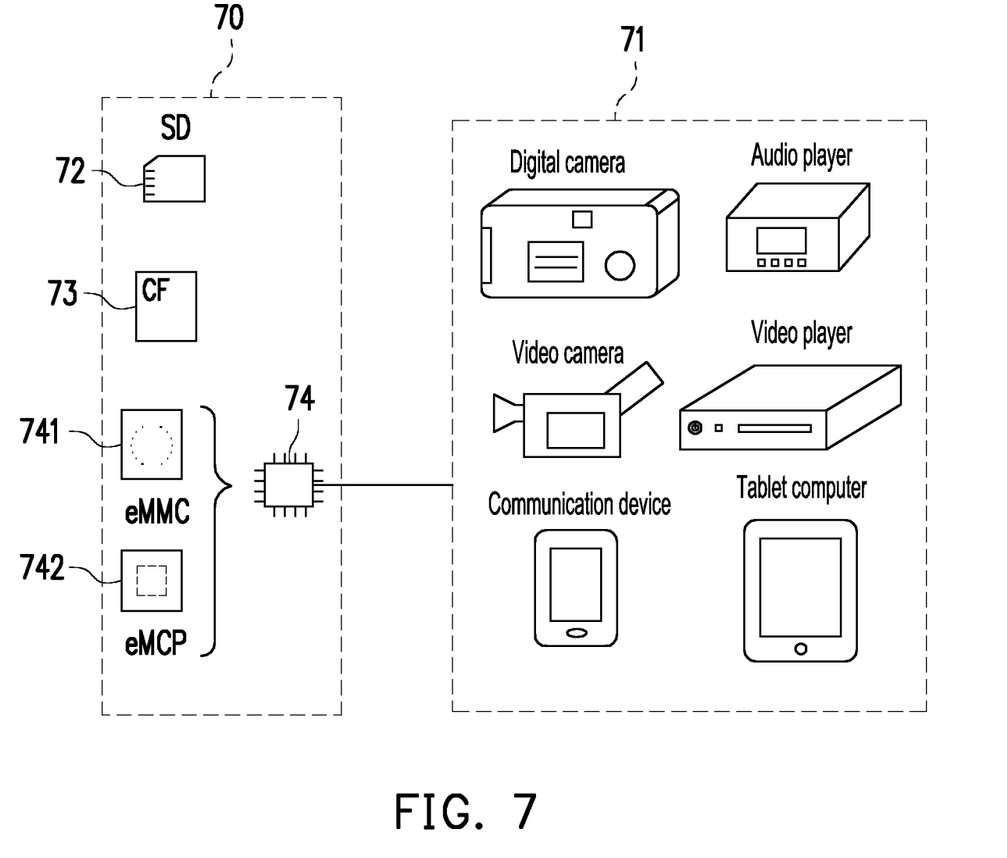
FIG. 7 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 7 is a schematic diagram illustrating a host system and a memory storage device according to another exemplary embodiment of the disclosure. Referring to FIG. 7, in another exemplary embodiment, a host system 71 may also be a system such as a digital camera, a video camera, a communication device, an audio player, a video player or a tablet computer, whereas a memory storage device 70 may be various non-volatile memory storage devices used by the host system, such as a SD (Secure Digital) card 72, a CF (Compact Flash) card 73 or an embedded storage device 74. The embedded storage device 74 includes various embedded storage devices capable of directly coupling a memory module onto a substrate of the host system, such as an eMMC (embedded Multi Media Card) 741 and/or an eMCP (embedded Multi Chip Package) storage device 742.

Figure 8:
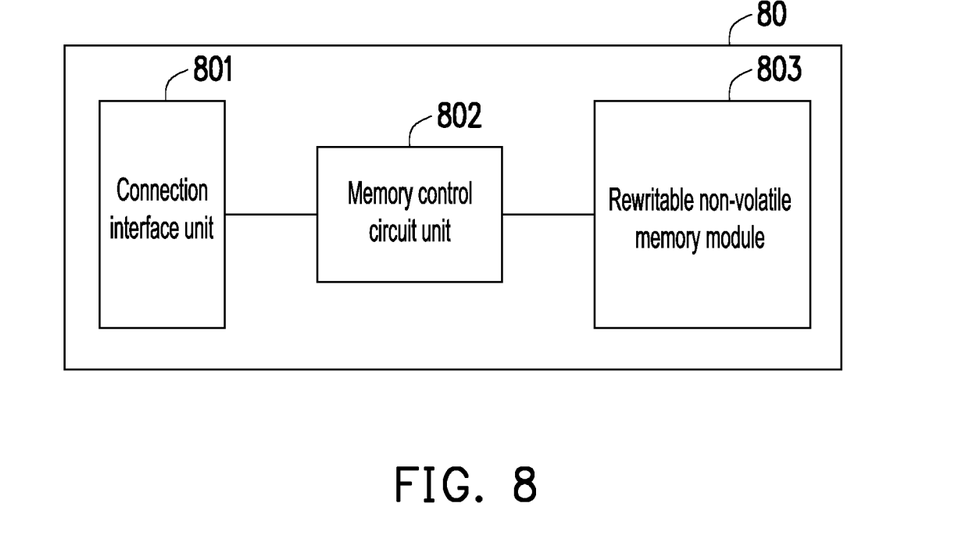
FIG. 8 is a schematic block diagram illustrating a memory storage device according to an exemplary embodiment of the invention.

FIG. 8 is a schematic block diagram illustrating a memory storage device according to an exemplary embodiment of the invention. Referring to FIG. 8, the memory storage device 80 includes a connection interface unit 801, a memory control circuit unit 802 and a rewritable non-volatile memory module 803. It should be noted that, the clock and data recovery circuit 10 of FIG. 1 may be disposed in the clock and data recovery circuit 801 to receive the signal Din from the host system 51. Alternatively, the clock and data recovery circuit 10 of FIG. 1 may also be disposed in the memory control circuit unit 802 and/or the rewritable non-volatile memory module 803, and the invention is not limited thereto.

The connection interface unit 801 is configured to couple to the memory storage device 80 to the host system. In the present exemplary embodiment, the connection interface unit 801 is compatible with a SATA (Serial Advanced Technology Attachment) standard. Nevertheless, it should be understood that the invention is not limited in this regard. The connection interface unit 801 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 801 and the memory control circuit unit 802 may be packaged into one chip, or the connection interface unit 801 is distributed outside of a chip containing the memory control circuit unit 802.

The memory control circuit unit 802 is configured to execute a plurality of logic gates or control commands which are implemented in a hardware form or in a firmware form and perform operations of writing, reading or erasing data in the rewritable non-volatile memory storage module 803 according to the commands of the host system.

The rewritable non-volatile memory module 803 is coupled to the memory control circuit unit 802 and configured to store data written from the host system. The rewritable non-volatile memory module 803 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quad Level Cell) NAND-type flash memory module (i.e., a flash memory module capable of storing four bits in one memory cell), other flash memory modules or other memory modules having the same features.

In the rewritable non-volatile memory module 803, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". With changes in the threshold voltage, each of the memory cells in the rewritable non-volatile memory module 406 has a plurality of storage states. The storage state to which the memory cell belongs may be determined by applying a read voltage to the memory cell, so as to obtain the one or more bits stored in the memory cell.

In the present exemplary embodiment, the memory cells of the rewritable non-volatile memory module 803 constitute a plurality of physical programming units, and the physical programming units constitute a plurality of physical erasing units. Specifically, the memory cells on the same word line constitute one or more of the physical programming units. If each of the memory cells can store two or more bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In this exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., management data such as the error correcting code). In this exemplary embodiment, the data bit area contains 32 physical sectors, and a size of each physical sector is 512 bytes (B). However, in other exemplary embodiments, the data bit area may also contain 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Figure 9:
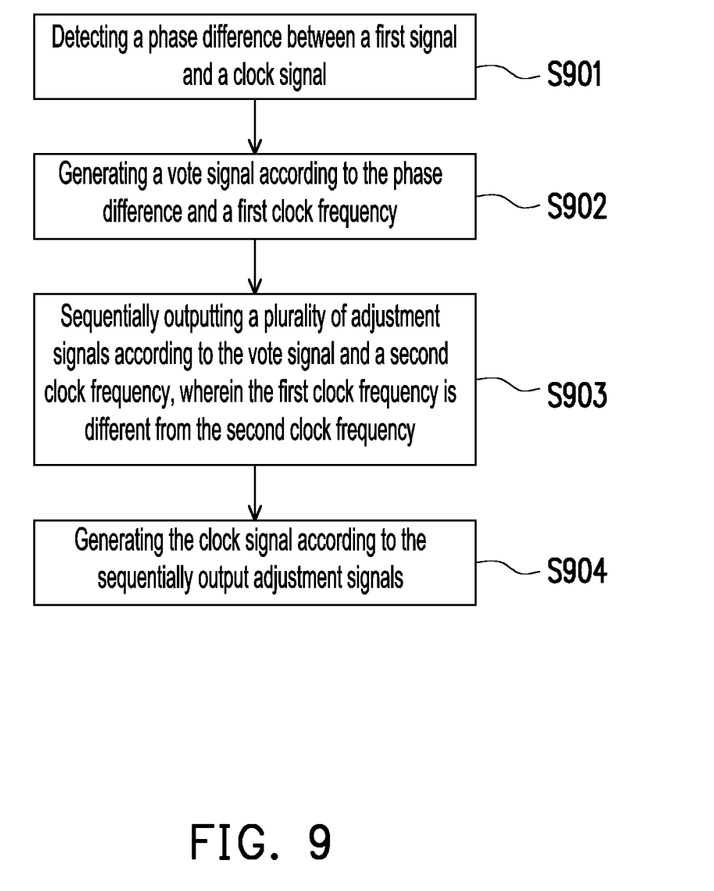
FIG. 9 is a flowchart illustrating a signal adjustment method according to an exemplary embodiment of the invention.

FIG. 9 is a flowchart illustrating a signal adjustment method according to an exemplary embodiment of the invention. Referring to FIG. 9, in step S901, a phase difference between a first signal and a clock signal is detected. In step S902, a vote signal is generated according to the phase difference and a first clock frequency. In step S903, a plurality of adjustment signals are sequentially output according to the vote signal and a second clock frequency. In step S904, the clock signal is generated according to the sequentially output adjustment signals.

Nevertheless, steps depicted in FIG. 9 are described in detail as above so that related description thereof is omitted hereinafter. It should be noted that, the steps depicted in FIG. 9 may be implemented as a plurality of program codes or circuits, which are not particularly limited in the invention. Moreover, the method disclosed in FIG. 9 may be implemented by reference with above exemplary embodiments, or may be implemented separately, which are not particularly limited in the invention.

In summary, in the exemplary embodiments of the invention, the voter circuit may operate at the first clock frequency and the digital loop filter may operate at the second clock frequency which is higher, so as to generate multiple adjustment signals in response to one vote signal. The sequentially output adjustment signals may be used to gradually adjust the clock signal generated by the clock and data recovery circuit to satisfy the target phase difference or the target frequency difference in multiple times. Compared with the clock signal adjusted at once time in the conventional art, by adjusting the clock signal in multiple times according to the exemplary embodiments of the invention, the clock and data recovery circuit may have a higher jitter tolerance.

What is claimed is:

1. A clock and data recovery circuit, comprising:
  a phase detector, configured to detect a phase difference between a first signal and a clock signal;
  a voter circuit, coupled to the phase detector and configured to generate a vote signal according to the phase difference and a first clock frequency;
  a digital loop filter, coupled to the voter circuit and configured to sequentially output a plurality of adjustment signals according to the vote signal and a second clock frequency, wherein the first clock frequency is different from the second clock frequency; and
  a phase interpolator, coupled to the phase detector and the digital loop filter and configured to generate the clock signal according to the sequentially output adjustment signals.

2. The clock and data recovery circuit according to claim 1, wherein the first clock frequency is lower than the second clock frequency.

3. The clock and data recovery circuit according to claim 1, wherein the digital loop filter comprises:
  an accumulator circuit; and
  a divider circuit, coupled to the accumulator circuit,
  wherein the accumulator circuit is configured to determine a first adjustment code according to the vote signal and the first clock frequency, and
  the divider circuit is configured to divide the first adjustment code into a plurality of second adjustment codes and generate the adjustment signals according to the second adjustment codes.

4. The clock and data recovery circuit according to claim 3, wherein the digital loop filter further comprises:
a multiplexer, coupled to the divider circuit and the phase interpolator and configured to sequentially output the adjustment signals to the phase interpolator according to the second clock frequency.

5. The clock and data recovery circuit according to claim 1, wherein the sequentially output adjustment signals are used to gradually adjust the clock signal to satisfy a target phase difference or a target frequency difference.

6. A memory storage device, comprising:
a connection interface unit, configured to couple to a host system;
a rewritable non-volatile memory module;
a memory control circuit unit, coupled to the connection interface unit and the rewritable non-volatile memory module,
a clock and data recovery circuit, disposed in at least one of the connection interface unit, the rewritable non-volatile memory module and the memory control circuit unit,
wherein the clock and data recovery circuit is configured to detect a phase difference between a first signal and a clock signal,
the clock and data recovery circuit is further configured to generate a vote signal according to the phase difference and a first clock frequency,
the clock and data recovery circuit is further configured to sequentially output a plurality of adjustment signals according to the vote signal and a second clock frequency,
the clock and data recovery circuit is further configured to generate the clock signal according to the sequentially output adjustment signals, and
the first clock frequency is different from the second clock frequency.

7. The memory storage device according to claim 6, wherein the first clock frequency is lower than the second clock frequency.

8. The memory storage device according to claim 6, wherein the clock and data recovery circuit comprises:
an accumulator circuit; and
a divider circuit, coupled to the accumulator circuit;
wherein the accumulator circuit is configured to determine a first adjustment code according to the vote signal and the first clock frequency, and
the divider circuit is configured to divide the first adjustment code into a plurality of second adjustment codes and generate the adjustment signals according to the second adjustment codes.

9. The memory storage device according to claim 8, wherein the clock and data recovery circuit further comprises:
a multiplexer, coupled to the divider circuit and configured to sequentially output the adjustment signals to a phase interpolator in the clock and data recovery circuit according to the second clock frequency.

10. The memory storage device according to claim 6, wherein the sequentially output adjustment signals are used to gradually adjust the clock signal to satisfy a target phase difference or a target frequency difference.

11. A signal adjustment method for a memory storage device, the memory storage device having a rewritable non-volatile memory module, the signal adjustment method comprising:
detecting a phase difference between a first signal and a clock signal;
generating a vote signal according to the phase difference and a first clock frequency;
sequentially outputting a plurality of adjustment signals according to the vote signal and a second clock frequency, wherein the first clock frequency is different from the second clock frequency; and
generating the clock signal according to the sequentially output adjustment signals.

12. The signal adjustment method according to claim 11, wherein the first clock frequency is lower than the second clock frequency.

13. The signal adjustment method according to claim 11, wherein the step of sequentially outputting the adjustment signals according to the vote signal and the second clock frequency comprises:
determining a first adjustment code according to the vote signal and the first clock frequency; and
dividing the first adjustment code into a plurality of second adjustment codes and generating the adjustment signals according to the second adjustment codes.

14. The signal adjustment method according to claim 13, wherein the step of sequentially outputting the adjustment signals according to the vote signal and the second clock frequency further comprises:
sequentially outputting the adjustment signals to a phase interpolator in the memory storage device according to the second clock frequency.

15. The signal adjustment method according to claim 11, wherein the sequentially output adjustment signals are used to gradually adjust the clock signal to satisfy a target phase difference or a target frequency difference.

16. A clock and data recovery circuit, comprising:
a phase detector;
a voter circuit, coupled to an output of the phase detector;
a digital loop filter, coupled to an output of the voter circuit; and
a phase interpolator, coupled to an output of the digital loop filter and the phase detector,
wherein the voter circuit operates at first clock frequency,
the digital loop filter operates at a second clock frequency, and
the first clock frequency is different from the second clock frequency.

17. The clock and data recovery circuit according to claim 16, wherein the first clock frequency is lower than the second clock frequency.

18. A memory storage device, comprising:
a connection interface unit, configured to couple to a host system;
a rewritable non-volatile memory module;
a memory control circuit unit, coupled to the connection interface unit and the rewritable non-volatile memory module,
a clock and data recovery circuit, disposed in at least one of the connection interface unit, the rewritable non-volatile memory module and the memory control circuit unit,
wherein a voter circuit in the clock and data recovery circuit operates at first clock frequency,
a digital loop filter in the clock and data recovery circuit operates at a second clock frequency,
the digital loop filter is coupled to an output of the voter circuit, and
the first clock frequency is different from the second clock frequency.

19. The clock and data recovery circuit according to claim 18, wherein the first clock frequency is lower than the second clock frequency.

\* \* \* \* \*